(12) United States Patent
McEwan et al.

(10) Patent No.: US 7,205,235 B2
(45) Date of Patent: Apr. 17, 2007

(54) METHOD FOR REDUCING CORROSION OF METAL SURFACES DURING SEMICONDUCTOR PROCESSING

(75) Inventors: Grant W. McEwan, Austin, TX (US); Scott C. Bolton, Austin, TX (US); Barry T. Haygood, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 62 days.

(21) Appl. No.: 10/736,395

(22) Filed: Dec. 15, 2003

(65) Prior Publication Data

US 2005/0130419 A1 Jun. 16, 2005

(51) Int. Cl.
*H01L 21/44* (2006.01)

(52) U.S. Cl. .................... 438/687; 438/637; 438/711

(58) Field of Classification Search ............. 438/687, 438/637–640, 675, 633, 691–69, 626, 710–711
See application file for complete search history.

(56) References Cited

U.S. PATENT DOCUMENTS

| 4,973,448 | A | 11/1990 | Carlson |
|---|---|---|---|
| 6,287,977 | B1 * | 9/2001 | Hashim et al. ............. 438/687 |
| 6,344,432 | B1 | 2/2002 | Wojtczak |
| 6,350,687 | B1 * | 2/2002 | Avanzino et al. ........... 438/687 |
| 6,383,928 | B1 * | 5/2002 | Eissa ........................ 438/687 |
| 6,482,750 | B2 | 11/2002 | Yokoi |
| 6,524,376 | B2 | 2/2003 | Aoki |
| 6,524,957 | B2 * | 2/2003 | Merchant et al. ........... 438/687 |
| 6,752,844 | B2 * | 6/2004 | Miller et al. ................. 51/307 |
| 6,784,105 | B1 * | 8/2004 | Yang et al. ................. 438/687 |
| 2001/0011515 | A1 | 8/2001 | Aoki |
| 2001/0050350 | A1 | 12/2001 | Wojtczak |
| 2002/0065204 | A1 | 5/2002 | Wojtczak |
| 2002/0132744 | A1 | 9/2002 | Wojtczak |
| 2002/0189643 | A1 | 12/2002 | Chen |
| 2003/0068853 | A1 | 4/2003 | Conti |
| 2003/0078173 | A1 | 4/2003 | Wojtczak |
| 2003/0083214 | A1 | 5/2003 | Kakizawa |
| 2003/0087534 | A1 | 5/2003 | Mallikarjunan |
| 2003/0114000 | A1 | 6/2003 | Noguchi |
| 2003/0203624 | A1 * | 10/2003 | Sameshima et al. ........ 438/687 |

FOREIGN PATENT DOCUMENTS

WO    WO 00/02238    1/2000

* cited by examiner

*Primary Examiner*—Thanh Nguyen
(74) *Attorney, Agent, or Firm*—James L. Clingan, Jr.; Michael Balconi-Lamica

(57) ABSTRACT

A semiconductor process exposes metal in anticipation of an additional processing step that includes a deposition of a layer. Between the two processing steps, the exposed metal is exposed to ambient conditions that may include humidity. The effect of the humidity is potentially to cause corrosion of the exposed metal causing a yield loss. In order to withstand the various time periods that may occur between processing steps, an inhibitor is applied to the exposed surface causing the formation of a very thin protective layer on the exposed metal, which greatly inhibits corrosion. This thin protective layer does not cause any problems with the subsequent step because the typical following steps all, by their very nature, remove the protective layer. Thus, the time period between the processing step that exposes the metal and the next step is no longer critical due to the protective layer.

4 Claims, 4 Drawing Sheets

METHOD FOR REDUCING CORROSION OF METAL SURFACES DURING SEMICONDUCTOR PROCESSING

FIELD OF THE INVENTION

This invention relates to semiconductor processing, and more particularly, to reducing corrosion of metal surfaces that are exposed during the processing.

RELATED ART

In the manufacturing of semiconductors, one of the problems has been corrosion of metal surfaces, especially when the metal is copper. This problem occurs primarily in one of two situations. One situation arises from the copper being deposited into trenches in an interlayer dielectric (ILD) and then subjected to chemical mechanical polishing (CMP). This CMP processing is in preparation for a subsequent ILD deposition, but this ILD deposition may not be able to be carried out immediately. Thus, there may be wafers with exposed copper that are in the ambient conditions of the fabrication facility. In such cases there is significant humidity. A typical amount of humidity is 40%. In this level of humidity, the copper begins corroding and given enough time, the corrosion is sufficient to cause two of the copper lines to be shorted together. One of the techniques to prevent this has been to have queue time rules that the wafers with the exposed copper can only be in the ambient conditions for a set amount of time. In practice, however, it is very difficult to keep such rules. The equipment that is used for subsequent processing may not be available for a variety of reasons, such as maintenance, repair, replacement, or qualification. This also may prevent optimum usage of the CMP. Optimum use of the CMP equipment can cause a big build-up in the amount of wafers with exposed copper. Such build-up can cause an imbalance on the work in process (WIP) in the line and thus force wafers to be exposed to the ambient for too long.

Similar problems occur during via formation in both copper and aluminum. In the case of vias, a hole is formed in the ILD above the metal layer and thereby the hole exposes a portion of the underlying metal. Exposure to the ambient causes the same corrosion situation. In this case the failure that is caused is an open instead of a short but the adverse effect is equally bad for both either a short or an open.

Thus, there is a need for a technique to allow for wafers to be able to have exposed metal surfaces for longer periods of time prior to the next stage in processing.

BRIEF DESCRIPTION OF THE DRAWINGS

The present invention is illustrated by way of example and not limited by the accompanying figures, in which like references indicate similar elements, and in which.

Figure 1:
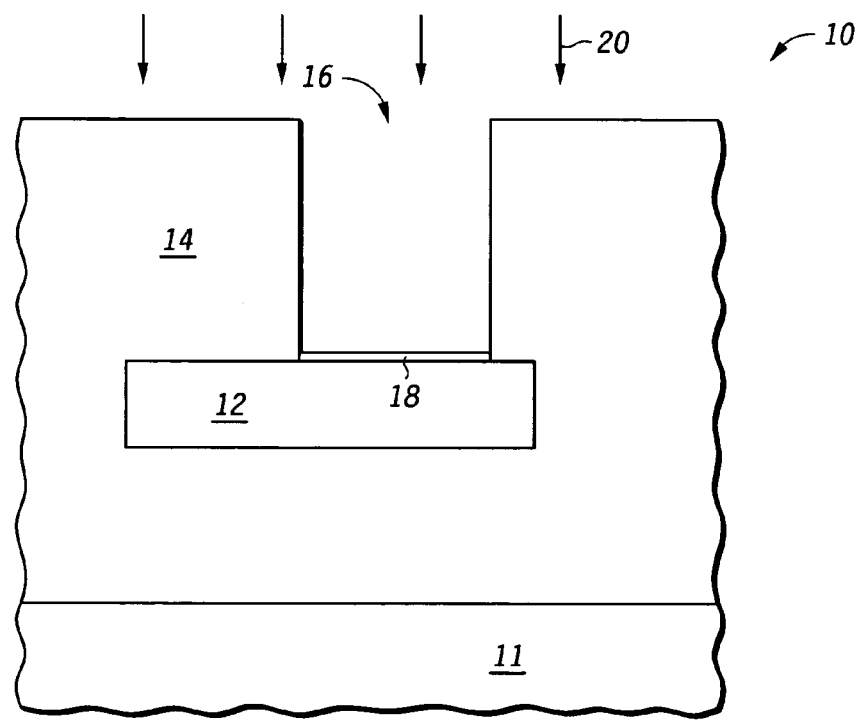
FIG. 1 is a cross section of a semiconductor device according to an embodiment of the invention at a stage in processing.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor process exposes metal in anticipation of an additional processing step that includes a deposition of a layer. Between the two processing steps, the exposed metal is exposed to ambient conditions that may include humidity. The effect of the humidity is potentially to cause corrosion of the exposed metal causing a yield loss. In order to withstand the various time periods that may occur between processing steps, an inhibitor is applied to the exposed surface causing the formation of a very thin protective layer on the exposed metal, which greatly inhibits corrosion. This thin protective layer does not cause any problems with the subsequent step because the typical following steps all, by their very nature, remove the protective layer. Thus, the time period between the processing step that exposes the metal and the next step is no longer critical due to the protective layer. This is better understood as shown in the drawings and described in the following description.

Shown in FIG. 1 is a semiconductor device 10 comprising a semiconductor substrate 11, a metal layer 12, an interlayer dielectric (ILD) 14, a via hole in ILD 14 to conductor 12, a protective layer 18, and a corrosion inhibitor 20 in the vapor phase. Semiconductor substrate 11 may be just semiconductor material, semiconductor on insulator (SOI), or another alternative useful as a substrate in semiconductor manufacturing. Metal layer 12 is preferably copper but may be another metal such as aluminum. Metal layer 12 is shown being immediately over substrate 11 for simplicity but in practice, there would other features, such as transistors, between substrate 11 and metal layer 12. ILD 14 is any dielectric useful for separating conductor layers. ILDs have generally been a form of silicon oxide but are becoming more preferably of a low k material. Protective layer 18 is formed by the application of corrosion inhibitor 20. Corrosion inhibitor 20 is applied in the vapor phase and results in protective layer 18 as a monolayer of corrosion inhibitor 20 bonded to metal layer 12. Inhibitor 20 may also be on ILD 14 but does not bond to ILD 14. Inhibitor 20 is a material that bonds to metal and inhibits the passage of moisture when so bonded. The choice of the exact composition of inhibitor 20 may be optimized for the particular metal being protected. Such inhibitors are commercially available from Cortec Corporation of St. Paul, Minn.

Without protective layer 18 and in the presence of moisture, a potential can develop that causes corrosion. Protective layer 18 inhibits this corrosion so that semiconductor device 10 of FIG. 1 can be exposed to typical ambient conditions with minimal risk of corrosion. Thus, there is no urgency in bringing semiconductor device 10 to the next step in processing. Inhibitor 20 may be applied by any convenient way but should be applied as soon as possible after via 16 exposes conductor 12. The application of inhibitor 20 may be by putting the wafers in a box with a source of inhibitor 20. In such case the source of inhibitor 20 can be a pad impregnated with inhibitor 20. Another approach is to apply inhibitor 20 immediately following the etch forming via 16 by direct application of inhibitor 20 to the wafers being etched. This can be achieved by an etch tool that has inlet for inhibitor 20.

Figure 2:
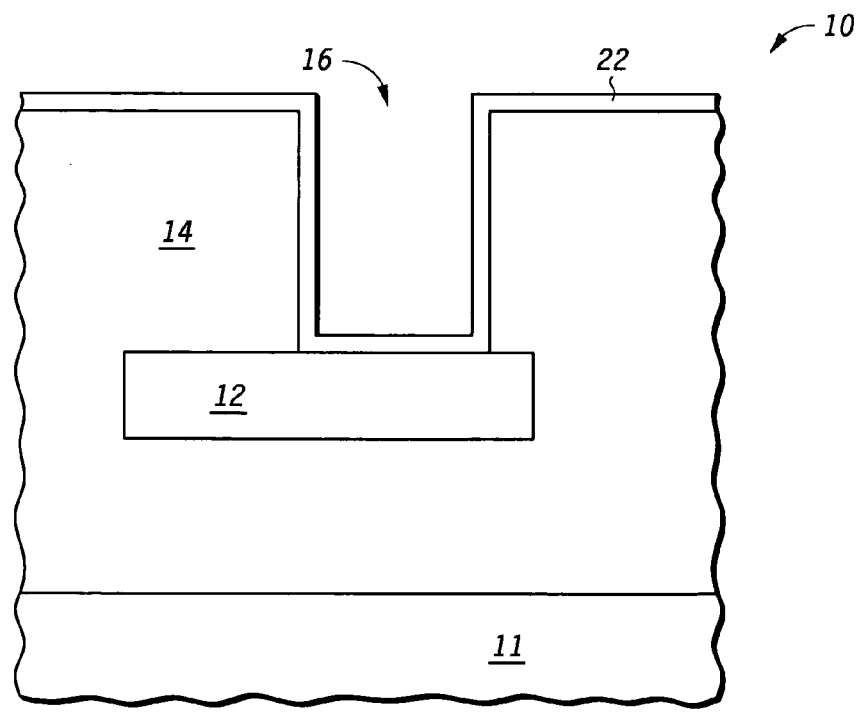
FIG. 2 is a cross section of the semiconductor device of FIG. 1 at a subsequent stage in processing.

Shown in FIG. 2 is a semiconductor device 10 after a layer 22 is deposited using plasma. Layer 22 can be variety of barriers. Examples of such barriers includes tantalum, tantalum nitride, or titanium nitride, as well as other barrier materials. In addition a seed layer of copper can be formed over the barrier layer. Thus layer 22 can be just a barrier layer or a composite of a barrier layer and a copper layer. Tantalum and tantalum nitride are both typically deposited by sputtering, which includes the use of plasma. Immediately prior to performing the sputter deposition, a preclean using an argon plasma is performed that has the effect of breaking up protective layer 18. Protective layer 18 is thus a sacrificial layer because it is removed after it has performed its beneficial function. This preclean is used for removing native oxide that is formed on the surface of metal conductor 12 at the bottom via 16. If such a preclean were not necessary, the sputtering step itself, because it uses plasma and is under vacuum, may be adequate to break up protective layer 18. After the preclean, layer 22 is deposited.

Figure 3:
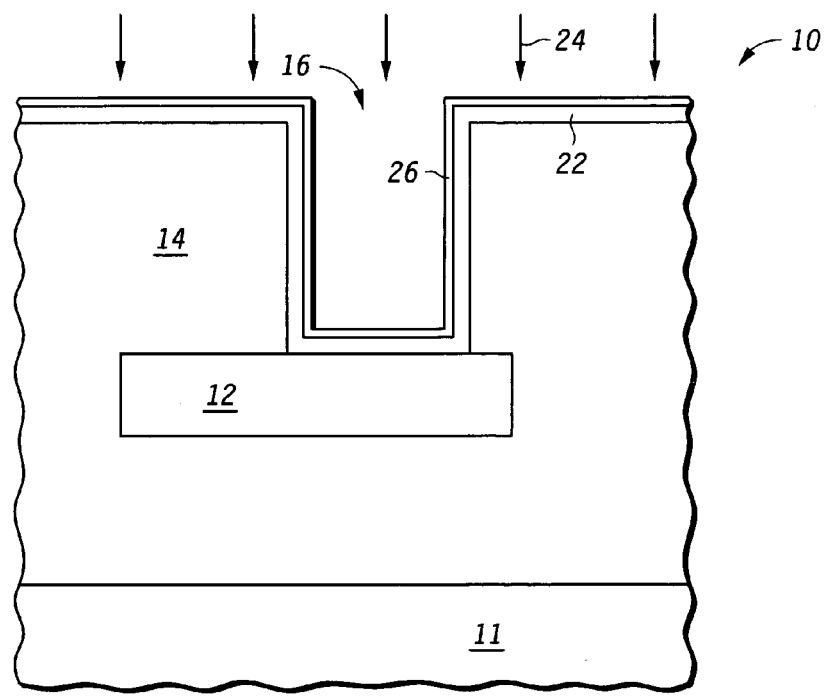
FIG. 3 is a cross section of the semiconductor device of FIG. 2 at a subsequent stage in processing.

Shown in FIG. 3 is semiconductor device 10 after application of inhibitor 24 that forms protective layer 26 over layer 22. Inhibitor 24 can be applied in the manner described for inhibitor 20 in FIG. 1 with an impregnated pad or similar to FIG. 1 as being applied to the wafers receiving the deposition while still in the deposition tool. The composition of inhibitor 24 may be preferably a somewhat different composition from that of inhibitor 20, especially if the layer 22 is of a different material from that of conductor 12.

Figure 4:
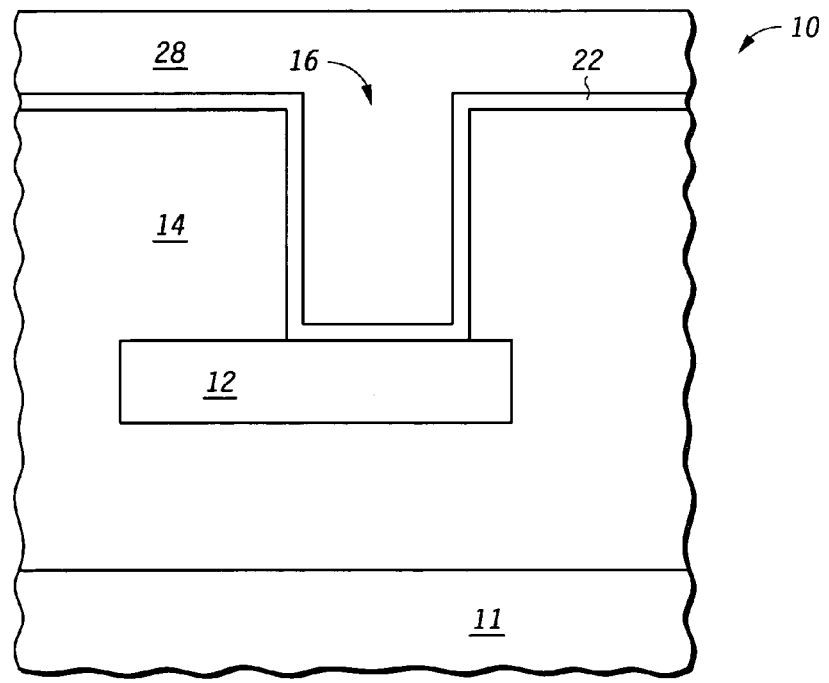
FIG. 4 is a cross section of the semiconductor device of FIG. 3 at a subsequent stage in processing.

Shown in FIG. 4 is semiconductor device 10 after via 16 has been filled by metal layer 28. In the case of layer 22 including a copper seed layer, metal layer 28 comprises copper. In the case of copper, layer 28 is deposited by electroplating which uses electrical pulses for the copper plating. In such case, layer 26 of FIG. 3 is removed immediately upon the application of the first electrical pulse. The electroplating process proceeds normally after such removal of layer 26. In the case of layer 12 being aluminum, layer 28 could be a via plug material, such as tungsten, or simply aluminum. In either case the deposition is preceded by a preclean such as that described for the preclean of conductor 12 prior to the deposition of layer 22.

Figure 5:
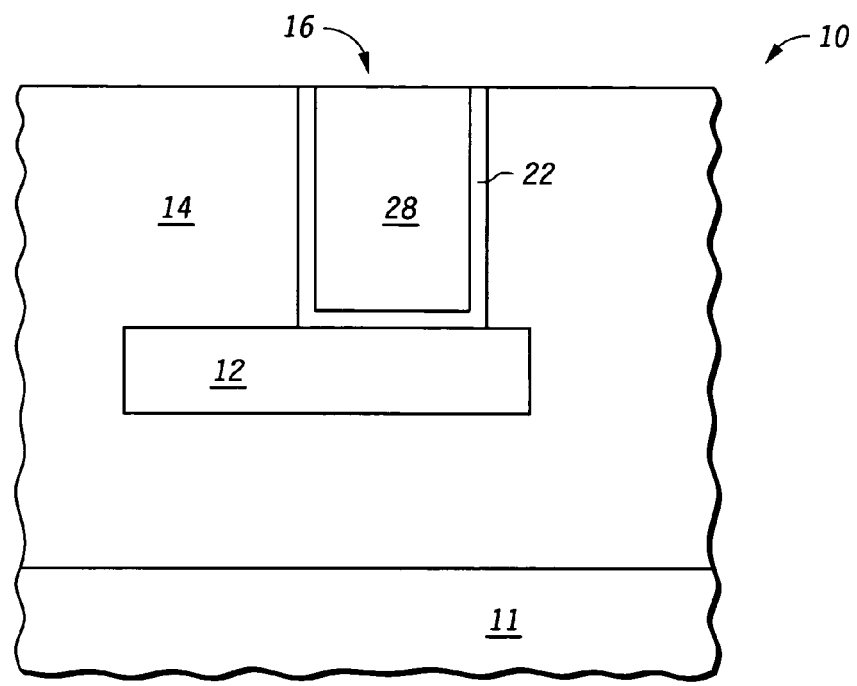
FIG. 5 is a cross section of the semiconductor device of FIG. 4 at a subsequent stage in processing.

Shown in FIG. 5 is a semiconductor device 10 after a chemical mechanical polishing (CMP) process particularly applicable to layer 28 being copper or tungsten fill. Layer 28 that fills via 16 thus has an exposed surface that is susceptible to corrosion in the presence of moisture present in typical ambient conditions. This situation shown in FIG. 5 is potentially even more at risk to corrosion than the via situation because adjacent lines may be very close together, whereas vias have depth in addition to the distance that the vias are apart.

Figure 6:
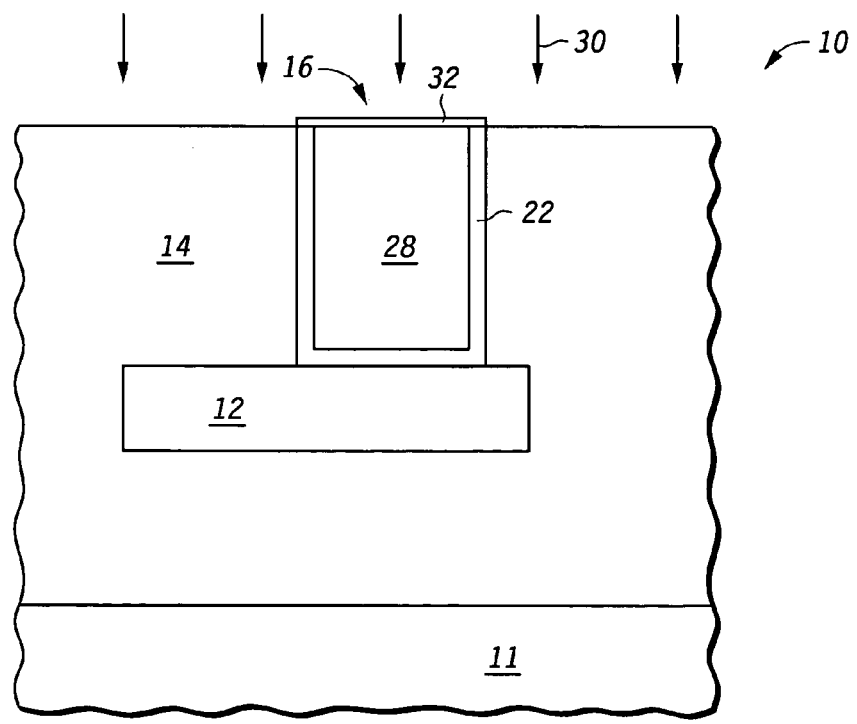
FIG. 6 is a cross section of the semiconductor device of FIG. 5 at a subsequent stage in processing.

Shown in FIG. 6 is semiconductor device 10 after application of inhibitor 30 to form protective layer 32 on layer 28 and layer 22 that is exposed. Inhibitor 30 may have a somewhat different composition from inhibitors 20 and 24, depending upon the particular metal type being protected.

Figure 7:
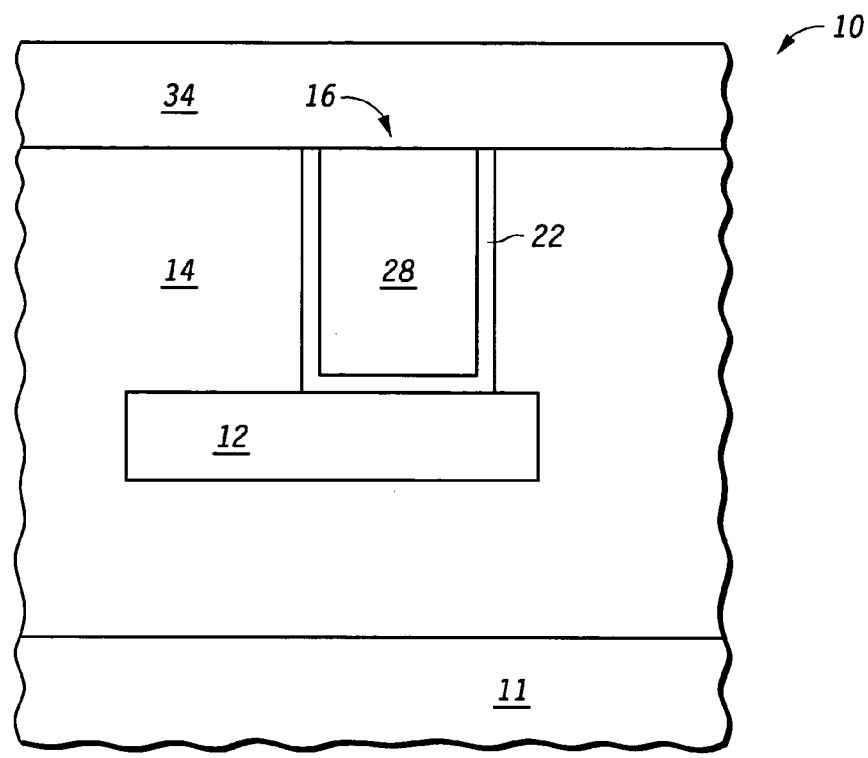
FIG. 7 is a cross section of the semiconductor device of FIG. 6 at a subsequent stage in processing.

Shown in FIG. 7 is semiconductor device 10 after formation of layer 34. In the case of layer 28 being copper, layer 34 is an ILD. In the case layer 28 being a tungsten plug or the like, layer 34 is aluminum. In the case of layer 34 being an ILD, layer 32 is broken up by the nature of the deposition of the ILD, which is a plasma enhanced deposition. In the case of layer 34 being aluminum, which is deposited by a sputtering process, there is a preclean as described for the deposition of layer 22.

Additional steps that expose metal use inhibitors in the same manner as appropriate as described for FIGS. 1–7. The use of inhibitors can extend even to the bond pads if found to have a corrosion problem.

Figure 8:
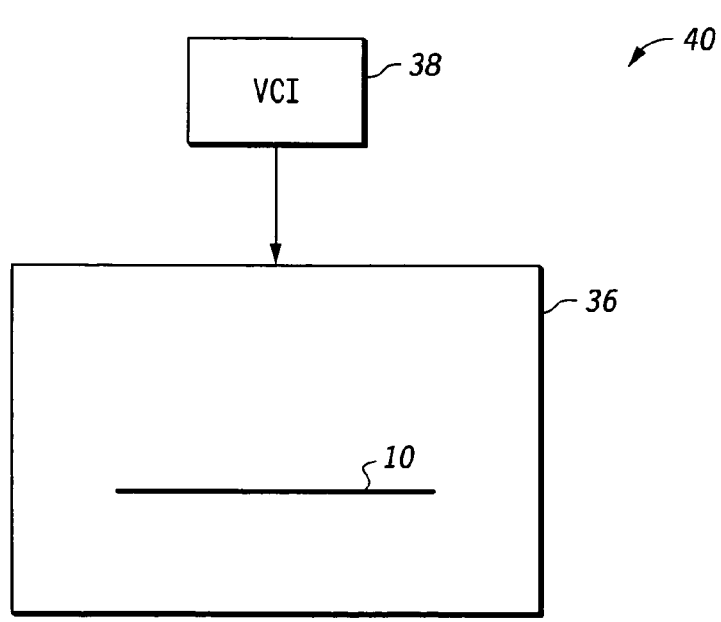
FIG. 8 is an apparatus useful in performing one or more of the processes used in the progression of steps shown in FIGS. 1–7.

Shown in FIG. 8 is an apparatus 40 comprising a tool 36 useful for processing semiconductor device 10 and a vapor corrosion inhibitor (VCI) source that supplies an inhibitor to semiconductor device 10 while semiconductor device 10 is present in tool 36. In operation, tool 36 performs a particular processing operation on semiconductor device 10 that exposes a metal surface. Exemplary processing steps include CMP processing, opening a via, and depositing a metal layer such as a barrier layer. Immediately upon completion of the processing step that exposes metal, the inhibitor from VCI source 38 is released to semiconductor wafer 10. This allows for minimum time between the processing which exposes the metal and the application of the inhibitor.

For a simpler alternative, instead of a tool 36, an enclosure that is impregnated with the inhibitor can be used. In a simple form, the box is simply lined with a material that is both capable of holding the inhibitor and sufficiently outgassing it to achieve the desired protective layer.

In the foregoing specification, the invention has been described with reference to specific embodiments. However, one of ordinary skill in the art appreciates that various modifications and changes can be made without departing from the scope of the present invention as set forth in the claims below. For example, specific examples of situations where metal is exposed were explained as benefiting from application of an inhibitor, but other situations that expose metal may also be situations that benefit from the application of an inhibitor. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for preventing corrosion of an exposed metal surface of a metal layer at a bottom of a via hole through a dielectric layer of a semiconductor device during semiconductor processing, comprising:

depositing and selectively bonding a sacrificial protective layer overlying the exposed metal surface of the semiconductor device, wherein the sacrificial layer protects the exposed metal surface at the bottom of the via hole from deleterious effects until subsequent processing of the semiconductor device; and subsequent processing of the semiconductor device, wherein the subsequent processing comprises a step of depositing a subsequent layer on the exposed metal surface, wherein the step of depositing the subsequent layer is begun without first removing the sacrificial layer and wherein the sacrificial protective layer is removed prior to completion of the step of depositing, wherein the depositing and selectively bonding comprises applying a corrosion inhibitor in the vapor phase to form the sacrificial layer on the exposed metal layer surface and the sacrificial layer consists of a monolayer of corrosion inhibitor.

2. The method of claim 1, wherein the metal comprises copper.

3. The method of claim 1, wherein the subsequent processing comprises electroplating the metal layer with copper.

4. The method of claim 1, wherein the metal layer comprises aluminum.

* * * * *